US012456976B2

(12) United States Patent
McEnroe

(10) Patent No.: US 12,456,976 B2
(45) Date of Patent: Oct. 28, 2025

(54) SWITCH CIRCUIT CONTROL

(71) Applicant: TEXAS INSTRUMENTS INCORPORATED, Dallas, TX (US)

(72) Inventor: Sean Patrick McEnroe, Mckinney, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/175,300

(22) Filed: Feb. 27, 2023

(65) Prior Publication Data

US 2024/0291482 A1    Aug. 29, 2024

(51) Int. Cl.
*H03K 17/68* (2006.01)
*H03K 17/687* (2006.01)
*H03K 19/017* (2006.01)

(52) U.S. Cl.
CPC ... *H03K 17/6871* (2013.01); *H03K 19/01714* (2013.01)

(58) Field of Classification Search
CPC .......... H03K 17/6871; H03K 17/6872; H03K 17/6874; H03K 17/063; H03K 17/06; H03K 19/01714; H03K 19/017; H03K 19/01735
See application file for complete search history.

(56) References Cited

U.S. PATENT DOCUMENTS

2013/0235669 A1* 9/2013 Maglione ........... H03K 17/6877
327/530

* cited by examiner

*Primary Examiner* — Jung Kim
(74) *Attorney, Agent, or Firm* — Mandy Barsilai Fernandez; Frank D. Cimino

(57) ABSTRACT

In some examples, an apparatus includes a switch circuit, a charge circuit, and a shutoff circuit. The switch circuit is configured to control passage of a data signal having a frequency of less than about 10 kilohertz (kHz) from an input terminal to an output terminal, the switch circuit having a control terminal. The charge circuit is coupled to a voltage supply and the switch circuit, wherein the charge circuit is configured to harvest a portion of current flowing through the switch circuit between the input terminal and the output terminal to maintain a charge at the control terminal greater than a programmed amount in a first state of operation and prevent charge from leaking from the control terminal. The shutoff circuit is coupled to the switch circuit and configured to discharge the charge at the control terminal in a second state of operation.

20 Claims, 5 Drawing Sheets

SWITCH CIRCUIT CONTROL

BACKGROUND

Some systems include circuits that pass or block a signal. These circuits may be subject to competing operational requirements, such that challenges may arise in meeting multiple of the operational requirements.

SUMMARY

In some examples, an apparatus includes a shutoff circuit, a switch circuit, a first capacitor, a second capacitor, a first diode, a second diode, and a third diode. The shutoff circuit has an input and including a first transistor having a control terminal and first and second terminals. The switch circuit includes at least a second transistor having a control terminal and first and second terminals, the control terminal of the second transistor is coupled to the first terminal of the first transistor, and the first terminal of the second transistor is coupled to the second terminal of the first transistor. The first capacitor has a first terminal coupled to a voltage terminal, and having a second terminal. The second capacitor has a first terminal coupled to the second terminal of the first capacitor, and having a second terminal coupled to the second terminal of the first transistor and to the first terminal of the second transistor. The first diode has a first anode and a first cathode, the first anode is coupled to the second terminal of the first capacitor and to the first terminal of the first capacitor, and the first cathode is coupled to the input of the shutoff circuit. The second diode has a second anode and a second cathode, the second anode is coupled to the second terminal of the second transistor, and the second cathode is coupled to the second terminal of the first capacitor to the second terminal of the first transistor and to the first terminal of the second transistor. The third diode has a third anode and a third cathode, the third anode is coupled to the second terminal of the first capacitor to the first terminal of the second capacitor to the anode of the first diode and to the cathode of the second diode, and the third cathode is coupled to the control terminal of the second transistor and to the first terminal of the first transistor.

In some examples, an apparatus includes a switch circuit, a charge circuit, and a shutoff circuit. The switch circuit is configured to control passage of a data signal having a frequency of less than about 10 kilohertz (kHz) from an input terminal to an output terminal, the switch circuit having a control terminal. The charge circuit is coupled to a voltage supply and the switch circuit, wherein the charge circuit is configured to harvest a portion of current flowing through the switch circuit between the input terminal and the output terminal to maintain a charge at the control terminal greater than a programmed amount in a first state of operation and prevent charge from leaking from the control terminal. The shutoff circuit is coupled to the switch circuit and configured to discharge the charge at the control terminal in a second state of operation.

In some examples, a system includes a sensor, a controller, a processing circuit, and a signal pass circuit. The sensor is configured to provide a sensor signal having a frequency of less than about 10 kHz. The controller is configured to provide an enable signal. The signal pass circuit has a first terminal input coupled to the sensor, a second input terminal coupled to the controller, and an output terminal coupled the processing circuit. The signal pass circuit includes a switch circuit, a charge circuit, and a shutoff circuit. The switch circuit has a control terminal, the switch circuit is configured to pass the sensor signal from the first input terminal to the output terminal. The charge circuit is coupled to a voltage supply terminal and the switch circuit. The charge circuit is configured to harvest a portion of current flowing through the switch circuit between the first input terminal and the output terminal to maintain a charge at the control terminal greater than a programmed amount in a first state of operation responsive to the enable signal having a first value. The shutoff circuit is coupled to the switch circuit and is configured to discharge the charge at the control terminal in a second state of operation responsive to the enable signal having a second value.

DETAILED DESCRIPTION

As described above, some systems include circuits, such as switch circuits or signal pass circuits, that pass or block a signal. In an example, such a circuit is referred to as a signal pass circuit. These circuits may be subject to competing operational requirements, such that challenges may arise in meeting multiple of the operational requirements. For example, to comply with an operational requirement related to safety, the circuit may operate with a voltage supply providing a supply voltage less than a programmed threshold amount. However, the signal being passed or blocked by the circuit may have high voltage swings such that to control the circuit, a signal having a voltage greater in value than the supply voltage is required. At least some circuit architecture techniques for generating such a signal having the voltage greater in value than the supply voltage may generate noise in the system. Some systems, such as measurement devices, may be sensitive to noise such that excessive noise may adversely affect operation of the system. Therefore, to comply with an operational requirement related to noise, the circuit may not be permitted to generate noise having a value greater than a programmed threshold value. Finally, operational requirements related to bandwidth may exist, such that the system has an operational bandwidth that exceeds the capabilities of at least some of these circuit architecture techniques.

Examples of this description provide for a circuit that includes a boot-strap architecture to charge switching elements, which facilitates the passing or blocking of a signal having a peak-to-peak voltage (Vpp) that exceeds a supply voltage of the circuit. In some examples, charge is harvested from the signal for use in charging the switching element. In some examples, the signal has a frequency of less than 10 kilohertz (kHz). In other examples, the signal has a frequency of greater than 10 kHz.

Figure 1:
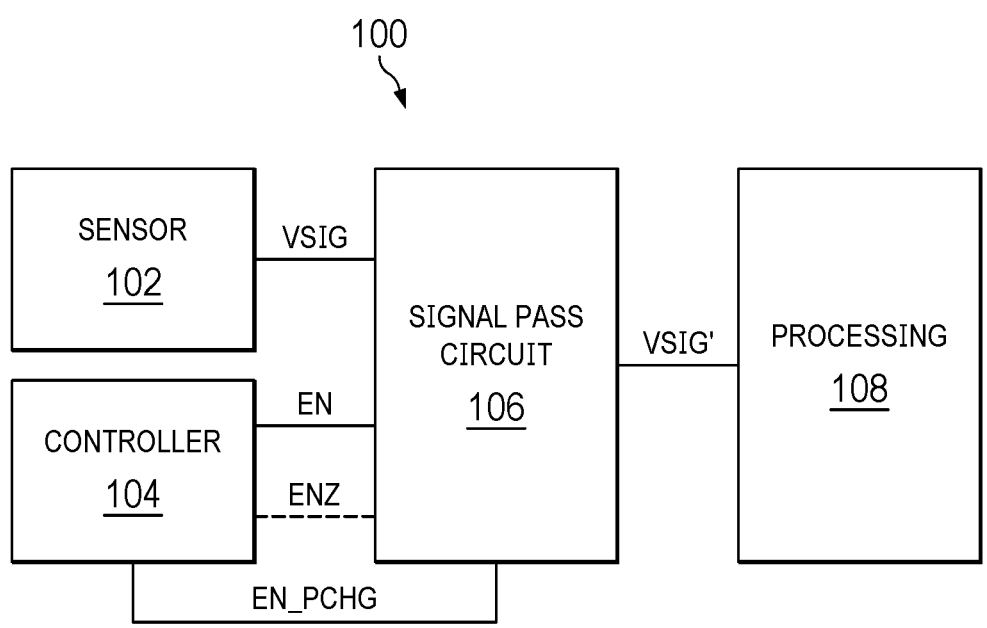
FIG. 1 is a block diagram of an example system.

FIG. 1 is a block diagram of an example system 100. In some examples, the system 100 is representative of a device that performs measurements or otherwise captures signals or data. As such, the system 100 may have operational requirements related to the generation of noise. In an example, the system 100 is representative of a medical device, such as an ultrasound machine. The system 100 includes a sensor 102, a controller 104, a signal pass circuit 106, and a processing circuit 108. In some examples, the sensor 102 is a pulse generator. In other examples, the sensor 102 is any component that provides a signal having a frequency. In some examples, the controller 104 is a logic circuit including a hardware architecture, or programming via software, firmware, or both, configured to cause the controller 104 to carry out particular actions. In some examples, the processing circuit 108 is a logic circuit including a hardware architecture, or programming via software, firmware, or both, configured to perform signal analysis or other operations. In some examples, the processing circuit 108 implements the controller 104, for example, as a microcontroller. The sensor 102 and the controller 104 are coupled to respective inputs of the signal pass circuit 106, which has an output coupled to the processing circuit 108. While couplings of the system 100 are shown as single couplings, in various examples multiple couplings may exist between any of the components of the system 100 (e.g., multiple couplings between the controller 104 and the signal pass circuit 106, etc.).

In an example of operation of the system 100, the sensor 102 provides a data signal (VSIG) to the signal pass circuit 106. The sensor 102 may provide VSIG according to any suitable process, the scope of which is not limited herein. VSIG may define data in an analog or digital domain and have a frequency greater than or less than about 25 megahertz (MHz), for example about 10 kHz, about 1 kHz, about 100 hertz (Hz), about 50 Hz, about 10 Hz, about 1 Hz, or about 0.01 Hz. In some examples, VSIG has a frequency in a range from about 0.01 Hz to about 25 MHz. The signal pass circuit 106 receives VSIG and may pass VSIG to the processing circuit 108 as VSIG' or block VSIG from being provided to the processing circuit 108 based on control of the controller 104. In some examples, passing VSIG to the processing circuit 108 as VSIG' includes the signal pass circuit 106 forming a conductive path through the signal pass circuit 106 from the sensor 102 to the processing circuit 108. In an example, VSIG' may have substantially a same value as VSIG, minus any losses associated with the conductive through the signal pass circuit 106. In some examples, blocking VSIG from being provided to the processing circuit 108 includes the signal pass circuit 106 creating an open circuit or otherwise non-conductive path through the signal pass circuit 106 from the sensor 102 to the processing circuit 108 such that VSIG cannot flow to the processing circuit as VSIG'.

For example, the controller 104 provides an enable signal (EN) to the signal pass circuit 106. In some examples, the controller 104 also provides an inverse of the enable signal (ENZ) to the signal pass circuit 106. In other examples, ENZ is derived from EN according to any suitable process such that EN and ENZ have inverse values. For example, an inverter (not shown) may receive EN and provide ENZ having an inverse value of EN. Responsive to EN having an asserted value, the signal pass circuit 106 provides VSIG to the processing circuit 108. Responsive to EN having a deasserted value (or ENZ having an asserted value), the signal pass circuit 106 blocks VSIG from being provided to the processing circuit 108.

Figure 2:
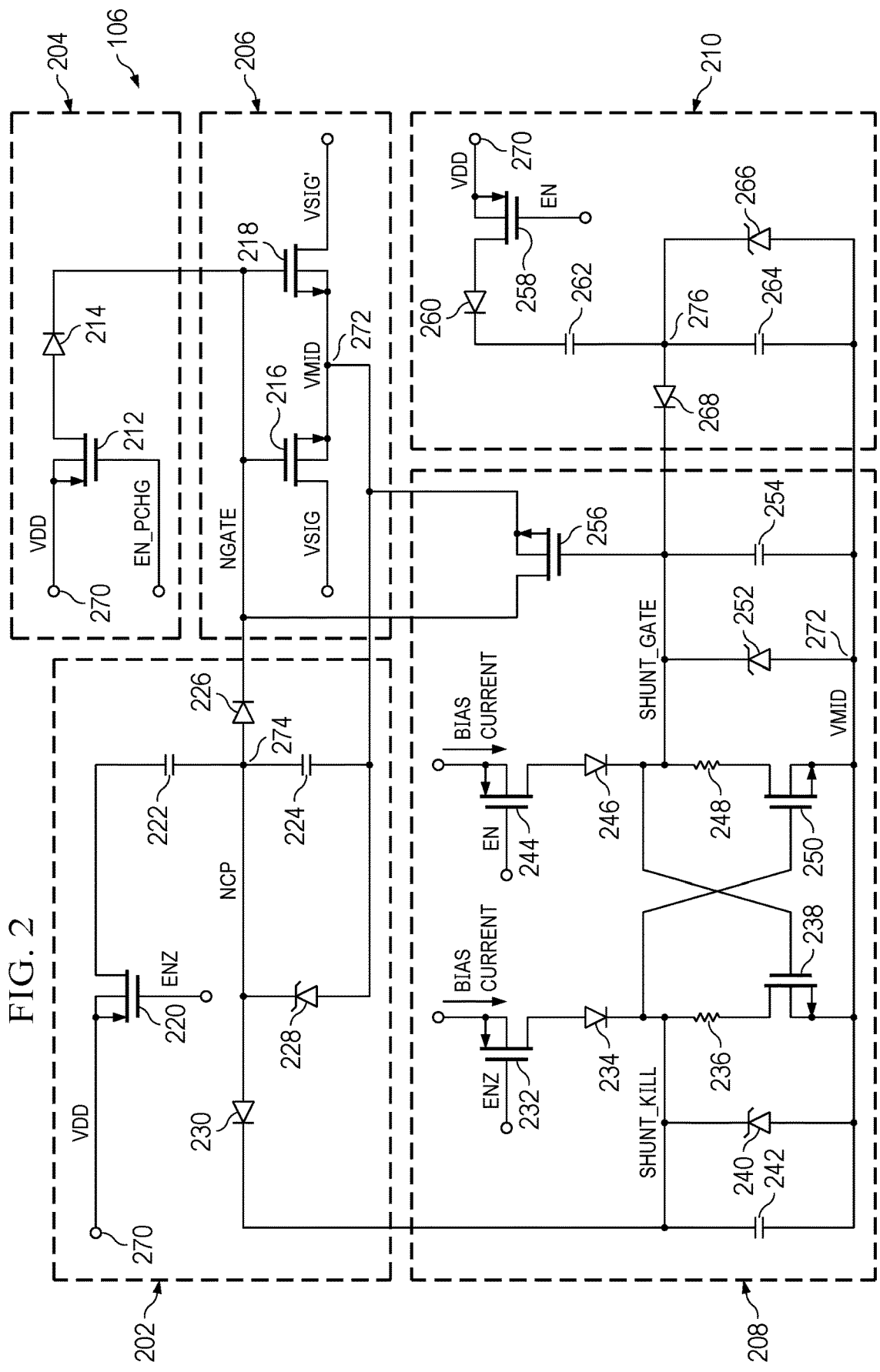
FIG. 2 is a schematic diagram of an example signal pass circuit.

FIG. 2 is a schematic diagram of an example signal pass circuit 106. In an example, the signal pass circuit 106 includes a precharge circuit 204, a switch circuit 206, a charge circuit 202, a shutoff circuit 208, and a charge circuit 210. The precharge circuit 204 includes a transistor 212 and a diode 214. The switch circuit 206 includes a transistor 216 and a transistor 218. The charge circuit 202 includes a transistor 220, a capacitor 222, a capacitor 224, a diode 226, a diode 228, and a diode 230. The shutoff circuit 208 includes a transistor 232, a diode 234, a resistor 236, a transistor 238, a diode 240, a capacitor 242, a transistor 244, a diode 246, a resistor 248, a transistor 250, a diode 252, a capacitor 254, and a transistor 256. The charge circuit 210 includes a transistor 258, a diode 260, a capacitor 262, a capacitor 264, a diode 266, and a diode 268. In an example, the signal pass circuit 106 receives EN at an enable signal terminal (not shown) and receives ENZ at an inverse enable signal terminal (not shown). In an example, the transistors 216, 218, 238, 250, and 256 are n-channel field-effect transistors (FETs) and the transistors 212, 220, 232, 244, 258 are p-channel FETs, each having a control terminal (gate) and first and second terminals (drain and source). In other examples, the transistors of the signal pass circuit 106 are different types of FETs or have any other suitable process technology.

In an example architecture of the signal pass circuit 106, the transistor 212 has a source coupled to a voltage supply terminal 270, a drain, and a gate. In an example, a supply voltage (VDD) is provided at the voltage supply terminal 270 by a voltage supply (not shown). In some examples, the transistor 212 receives a precharge enable signal (EN_PCHG) at its gate from any suitable source, such as the controller 104, the scope of which is not limited herein. In an example, the transistor 212 couples to a precharge enable signal terminal (not shown) to receive EN_PCHG. The diode 214 has an anode couple to the drain of the transistor 212, and a cathode. The transistor 216 has a gate coupled to the cathode of the diode 214, a drain coupled to the sensor 102 to receive VSIG, and a source. The transistor 218 has a gate coupled to the cathode of the diode 214, a source coupled to the source of the transistor 216, and a drain coupled to the processing circuit 108. In an example, a coupling between the source of transistor 216 and the source of the transistor 218 may be referred to as an intermediate node 272 of the switch circuit 206, at which a signal VMID is provided. In an example, the gates of the transistors 216, 218 are collectively referred to as the control terminal of the switch circuit 206. The drain of the transistor 216 is referred to as an input terminal of the switch circuit 206 (and of the signal pass circuit 106), and the drain of the transistor 218 is referred to as an output terminal of the switch circuit 206 (and of the signal pass circuit 106).

The transistor 220 has a gate, a source coupled to the voltage supply terminal 270, and a drain. In some examples, the transistor 220 receives ENZ at its gate, such as from the controller 104 or from another component that provides ENZ based on EN. The capacitor 222 is coupled to the drain of the transistor 220 and to a node 274. The capacitor 224 is coupled to the node 272 and to the node 274. The diode 226 has an anode coupled to the node 274 and a cathode coupled to the gate of the transistor 216. The diode 228 has an anode coupled to the node 272 and a cathode coupled to the node 274. In an example, the diode 228 is a Zener diode. The diode 230 has an anode coupled to the node 272 and a cathode.

The transistor 232 has a source, a gate, and a drain. In some examples, the transistor 232 receives a first bias current at its source. The bias current may be received from any suitable source, the scope of which is not limited herein. In some examples, the transistor 232 receives ENZ at its gate, such as from the controller 104 or from another component that provides ENZ based on EN. The diode 234 has an anode coupled to the drain of the transistor 232 and a cathode. The resistor 236 is coupled to the cathode of the diode 234 and a drain of the transistor 238. The transistor 238 also has a source coupled to the node 272, and has a gate. The diode 240 has an anode coupled to the node 272 and a cathode coupled to the cathode of the diode 234. In an example, the diode 240 is a Zener diode. The capacitor 242 is coupled to the cathode of the diode 234 and the node 272. The transistor 244 has a source, a gate, and a drain. In some examples, the transistor 244 receives a second bias current at its source. The bias current may be received from any suitable source, the scope of which is not limited herein, and in some examples may be the same signal as the first bias current. In some examples, the transistor 244 receives EN at its gate, such as from the controller 104. The diode 246 has an anode coupled to the drain of the transistor 244 and a cathode coupled to the gate of the transistor 238. The resistor 248 is coupled to the cathode of the diode 246 and to a drain of the transistor 250. The transistor 250 also has a source coupled to the node 272 and a gate coupled to the cathode of the diode 234. The diode 252 has an anode coupled to the node 272 and a cathode coupled to the cathode of the diode 246. In an example, the diode 252 is a Zener diode. The capacitor 254 is coupled to the cathode of the diode 246 and to the node 272. The transistor 256 has a gate coupled to the cathode of the diode 246, a source coupled to the node 272, and a drain coupled to the gates of the transistors 216, 218.

The transistor 258 has a gate, a source coupled to the voltage supply terminal 270, and a drain. In some examples, the transistor 258 receives EN at its gate, such as from the controller 104. The diode 260 has an anode coupled to the drain of the transistor 258 and a cathode. The capacitor 262 is coupled to the cathode of the diode 260 and to a node 276. The capacitor 264 is coupled to the node 276 and to the node 272. The diode 266 has an anode coupled to the node 272 and a cathode coupled to the node 276. In an example, the diode 266 is a Zener diode. The diode 268 has an anode coupled to the node 276 and a cathode coupled to the gate of the transistor 256.

In an example of operation of the signal pass circuit 106, the switch circuit 206 passes or blocks VSIG based on control by the charge circuit 202, shutoff circuit 208, charge circuit 210, and/or controller 104. For example, responsive to EN having an asserted value, such as a value of logic 1 in a voltage domain bounded by VDD and a ground voltage potential (GND), the switch circuit 206 passes VSIG to the processing circuit 108. Responsive to EN having a deasserted value, such as a value of logic 0 in the voltage domain bounded by VDD and GND, the switch circuit 206 blocks passage of VSIG to the processing circuit 108.

First, an example in which EN is asserted, and therefore ENZ is deasserted, is described. At a time of startup of the signal pass circuit 106, the gates of the transistors 216, 218 may be charged to cause a voltage having a value greater than a voltage of VSIG to be provided at the gates of the transistors 216, 218. The voltage provided at the gates of the transistors 216, 218 may be referred to herein as NGATE. In an example, NGATE has a value at least a threshold amount greater than VSIG, where the threshold amount is a gate to source threshold voltage of the transistors 216, 218. In some examples, this threshold amount is about 0.7 volts (V). In some examples, the charge is provided by the precharge circuit 204. For example, responsive to EN_PCHG having a value sufficient to cause the transistor 212 to become conductive, charge flows from the voltage supply (not shown) coupled to the voltage supply terminal 270 through the diode 214 to the gates of the transistors 216, 218, causing the transistors 216, 218 to become conductive. Subsequently, such as after a programmed amount of time or responsive to a determination made based on a value of one or more signals provided in the signal pass circuit 106, EN_PCHG may be controlled to have a value sufficient to cause the transistor 212 to become nonconductive.

In some examples, the signal pass circuit 106 may not include the precharge circuit 204. In such examples, at startup of the signal pass circuit 106, the gates of the transistors 216, 218 may be charged by the charge circuit 202. Responsive to VSIG decreasing in value to approximately equal to, or less than, a ground voltage potential, such as a result of a falling edge occurring in VSIG, a parasitic path is formed between the drain and source of the transistor 216. For example, a parasitic diode (not shown) becomes forward biased. In response, the node 272 is pulled down through this parasitic path to approximately equal VSIG. Responsive to the node 272 being pulled down to approximately equal the ground voltage potential, capacitive division between the capacitors 222, 224 causes a voltage provided at the node 274 to have a greater value than VMID. In an example, a value of a voltage provided at the node 274 may be referred to as NCP. Responsive to NCP having a greater value than VMID, current flows from the node 274 through the diode 226 to charge the gates of the transistors 216, 218, causing the transistors 216, 218 to become conductive. Similarly, current flows from the node 274 through the diode 230 to disable the shutoff circuit 208.

Responsive to the transistors 216, 218 becoming conductive, the switch circuit 206 passes VSIG to the processing circuit 108. In an example, a voltage loss occurs as VSIG passes through the transistors 216, 218 such that the voltage provided at the node 272 has a value of VMID, which may be less than VSIG, and a voltage provided to the processing circuit 108 may be an approximately equal amount less than VMID. In some examples, a first portion of current flowing through the node 272 flows through the transistor 218 and a second portion of current flowing through the node 272 flows through the diode 228 to the node 274. Current flows through the diode 226 to the gates of the transistors 216, 218. Responsive to EN having an asserted value (and correspondingly ENZ having a deasserted value), current flows through the transistor 220 to charge the node 274, and in turn charge the gates of the transistors 216, 218. Also responsive to EN having an asserted value (and correspondingly ENZ having a deasserted value), the transistor 232 is conductive, causing the first bias current to flow through the transistor 232 and diode 234 to the gate of the transistor 250. This first bias current may control the transistor 250 to become conductive, pulling the gate of the transistor 256 to VMID such that a gate-to-source voltage (Vgs) of the transistor 256 is approximately zero and insufficient for the transistor 256 to turn on. The asserted value of EN may also cause the transistor 244 and the transistor 258 to be turned off.

Responsive to an occurrence of a falling edge in VSIG, VMID decreases in value. Capacitive division between the capacitors 222, 224 cause NCP to have a value greater than VMID. Current flows from the node 274 through the diode 226 to charge the gates of the transistors 216, 218 and maintain a value of NGATE. Similarly, current flows from the node 274 through the diode 230 to maintain the transistor 250 in a conductive state such that the transistor 256 is held off. The diode 228 clamps the node 274 to a breakdown voltage of the diode 228, and the diode 240 clamps the gate of the transistor 250 to a breakdown voltage of the diode 240 to protect against high voltage damage.

Responsive to an occurrence of a rising edge in VSIG, VMID increases in value. Responsive to VMID increasing in value to be greater than NCP, current flows from the node 272 through the diode 228 to the node 274. The current flowing into the node 274 from the node 272 causes NCP to increase in value and charge the capacitor 222 to approximately a peak value of VMID minus a voltage drop of the diode 228.

During a flat period of VSIG, such as between two edges, whether rising and falling or falling and rising, the diodes 226, 230, 234, 246, 260, and 268 function as blocking diodes. The blocking diodes prevent current from flowing in a reverse-bias direction (e.g., from cathode to anode). The capacitors 222, 224, 242, 254, 262, and 264 function as charge reservoirs, storing charge to maintain voltages on the nodes to which they are coupled, holding the signal pass circuit 106 in its state of operation irrespective of VSIG. In an example, the combination of the blocking diodes and charge reservoirs of the signal pass circuit enable the signal pass circuit 106 to facilitate a transfer of VSIG having a wide frequency range, such as about 0.01 Hz to about 25 MHz. For example, the blocking diodes mitigate leakage of current from nodes to which they are coupled, enabling NGATE to withstand a longer period of VSIG having a logic low value, such as occurs as VSIG decreases in frequency. Similarly, the charge reservoirs provide a greater amount of charge regeneration for nodes to which they are coupled, also enabling the signal pass circuit 106 to withstand a longer period of VSIG having a logic low value.

In some examples, a tradeoff may be designed between a minimum frequency of VSIG for which the signal pass circuit 106 can continue operation and a size of the capacitors 222, 224, 242, 254, 262, and 264. For example, to reduce a physical size of the signal pass circuit 106, a capacitance of at least some of the capacitors 222, 224, 242, 254, 262, and 264 may be reduced. The reduction in capacitance may increase the minimum frequency of VSIG for which the signal pass circuit 106 can operate. Thus, in some examples the signal pass circuit 106 is designed according to a particular application environment in which the signal pass circuit 106 is to be implemented, considering both VSIG frequency and physical size.

Next, an example in which EN is deasserted, and therefore ENZ is asserted, is described. Responsive to EN having a deasserted value (and correspondingly ENZ having an asserted value), the transistor 220 becomes nonconductive, blocking the flow of current from the voltage supply terminal 270 to the node 274, and thereby causing the node 274 to discharge through the diode 226 and the diode 230 until no charge remains at the node 274. Also responsive to EN having a deasserted value (and correspondingly ENZ having an asserted value), the transistor 232 is non-conductive and the transistor 244 is conductive, causing the second bias current to flow through the transistor 244 and diode 246 to the gate of the transistor 238. This second bias current may control the transistor 238 to become conductive, pulling the gate of the transistor 250 to GND to turn off the transistor 250. The second bias current also flows to the gate of the transistor 256, charging the gate and causing the transistor 256 to become conductive. Responsive to the transistor 256 becoming conductive, the switch circuit 206 is disabled and passage of VSIG to the processing circuit 108 is blocked. For example, while conductive, the transistor 256 functions as a short between the gates of the transistors 216, 218 and the sources of the transistors 216, 218, approximately equalizing voltages provided at each. In response, a Vgs of the transistors 216, 218 is insufficient to cause the transistors 216, 218 to be conductive, and the passage of VSIG from the sensor 102 to the processing circuit 108 is blocked.

Voltages of VDD, EN, ENZ, and VSIG may generally be determined according to an application environment of the signal pass circuit 106 and safe operating ranges of components of the signal pass circuit 106, such as voltages that transistors of the signal pass circuit 106 are capable of withstanding without damage. Thus, changes in process technology or transistor design may change (e.g., increase or decrease) possible voltage ranges of VDD, EN, ENZ, and/or VSIG. In some examples, VDD has a value in a range of about 3.3 V to about 5.5 V. EN and ENZ may have a value approximately equal to VDD. In some examples, VSIG has a value in a range of a ground voltage potential (GND) to about 120 V, or a range of about −120 V to about 120 V. The first and second bias currents may have any suitable value, such as about 1 microamp (uA).

Figure 3:
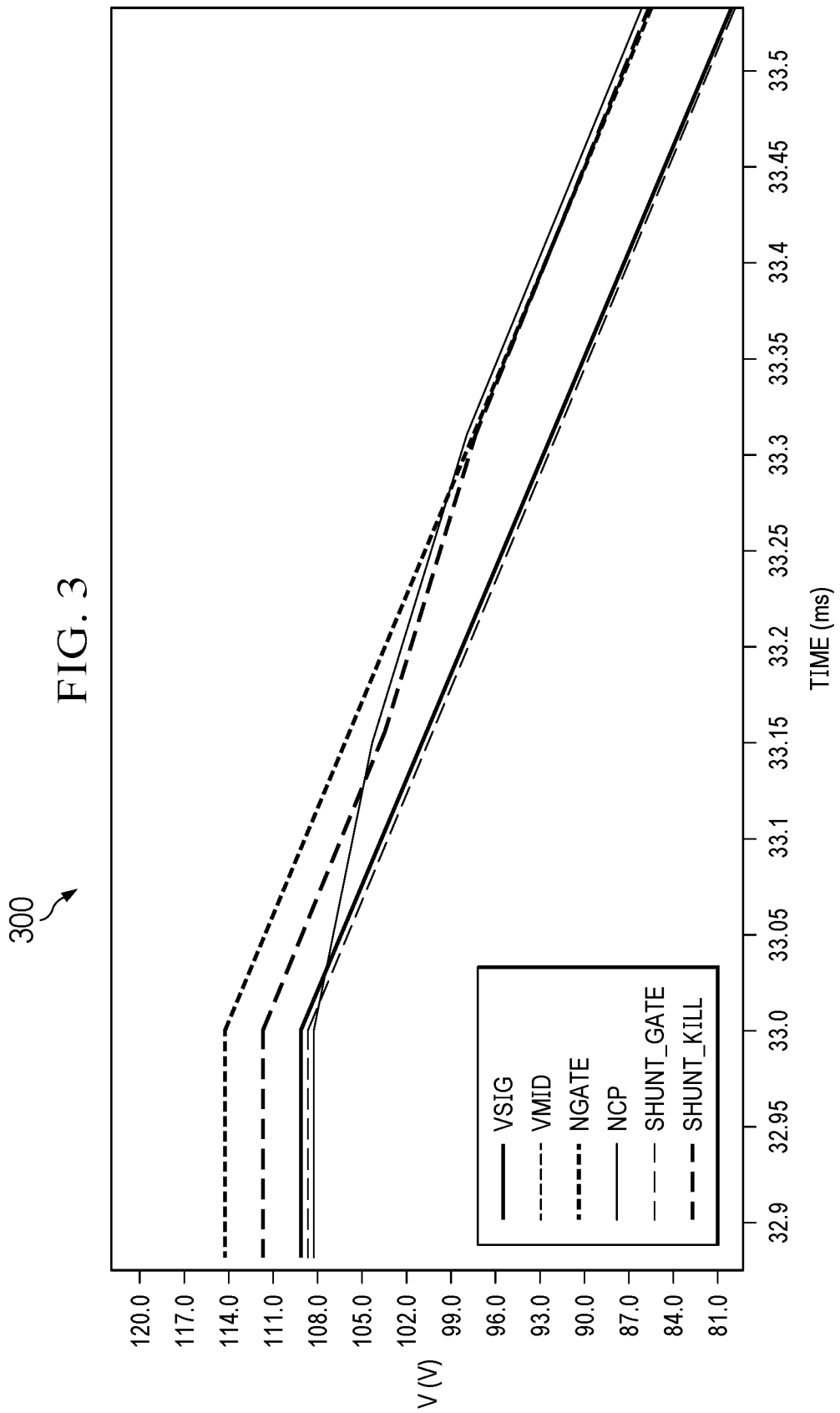
FIG. 3 is a timing diagram of example signals.

FIG. 3 is a timing diagram 300 of example signals. In some examples, the signals shown in the timing diagram 300 are representative of at least some signals that may be provided in a circuit such as the signal pass circuit 106. Accordingly, reference may be made to components of the signal pass circuit 106, or other figures of this description, in describing the timing diagram 300. The timing diagram 300 includes VSIG, VMID, NGATE, NCP, each as described above herein, a voltage provided at the gate of the transistor 238 (referred to in FIG. 3 as SHUNT_GATE), and a voltage provided at the gate of the transistor 238 (referred to in FIG. 3 as SHUNT_KILL). The timing diagram 300 is shown for the example in which EN is asserted, and correspondingly ENZ is deasserted. The timing diagram 300 is shown having a horizontal axis representative of time in units of milliseconds (ms) and a vertical axis representative of voltage in units of V. The timing diagram 300 is shown for VSIG having a frequency of approximately 50 Hz. The timing diagram 300 shows the signals noted above responsive to receipt of a falling edge of VSIG.

As shown in the timing diagram 300, the falling edge in VSIG is translated to a falling edge in VMID through the transistor 216. Via the coupling to the voltage supply terminal 270 through the transistor 220 and the capacitor 222, the node 274 is held high to have a voltage greater than VSIG and VMID. In response to NCP becoming greater than a threshold amount (e.g., approximately 0.7 V) greater than SHUNT_KILL, current flows through the diode 230 to cause SHUNT_KILL to increase in value in an amount proportional to NCP. Responsive to NCP becoming a threshold amount greater than NGATE, current flows through the diode 226 to cause NGATE to increase in value, maintaining sufficient charge on the gates of the transistors 216, 218 to hold the transistors 216, 218 in a conductive state.

Figure 4:
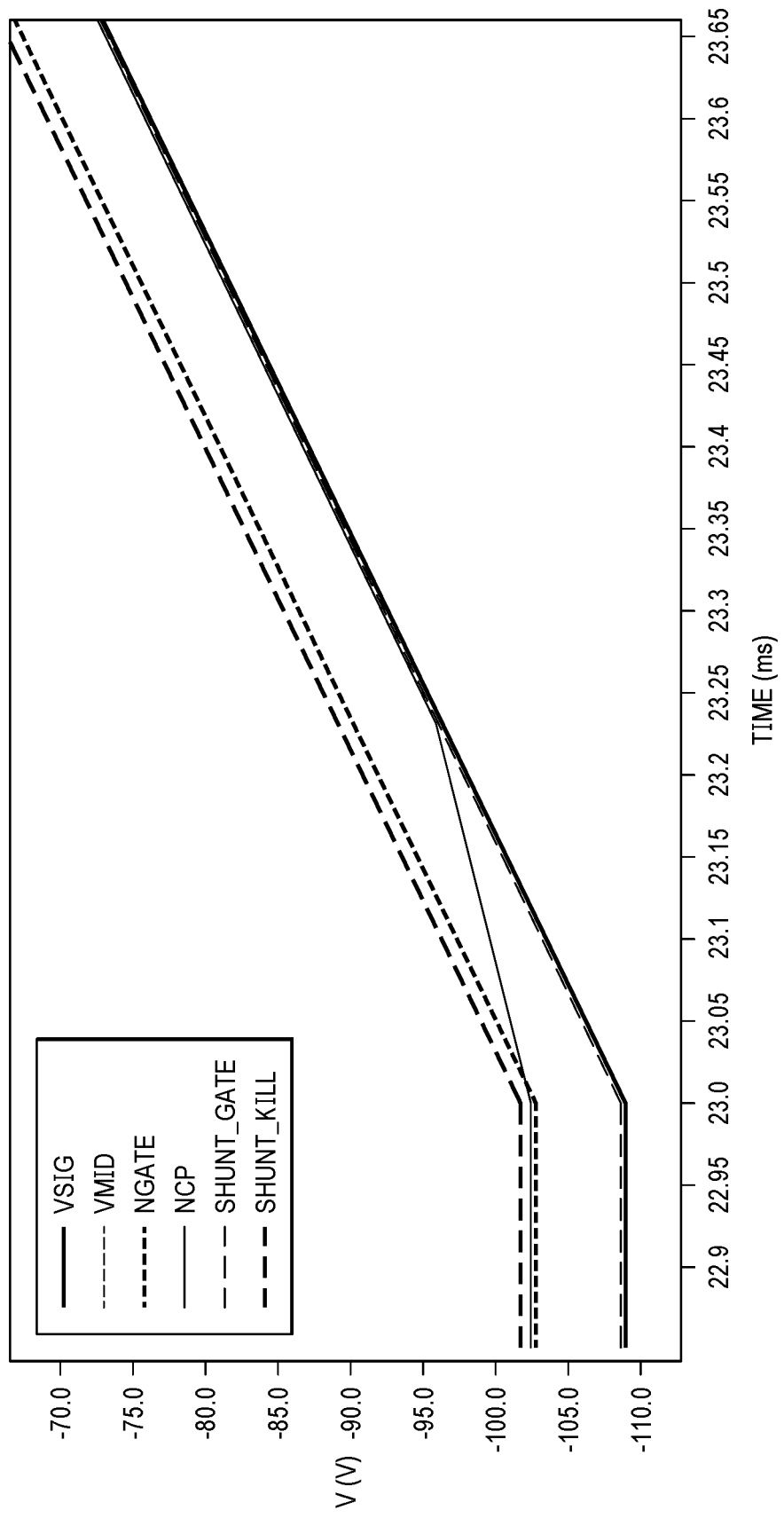
FIG. 4 is a timing diagram of example signals.

FIG. 4 is a timing diagram 400 of example signals. In some examples, the signals shown in the timing diagram 400 are representative of at least some signals that may be provided in a circuit such as the signal pass circuit 106. Accordingly, reference may be made to components of the signal pass circuit 106, or other figures of this description, in describing the timing diagram 400. The timing diagram 400 includes VSIG, VMID, NGATE, NCP, each as described above herein, a voltage provided at the gate of the transistor 238 (referred to in FIG. 4 as SHUNT_GATE), and a voltage provided at the gate of the transistor 238 (referred to in FIG. 4 as SHUNT_KILL). The timing diagram 400 is shown for the example in which EN is asserted, and correspondingly ENZ is deasserted. The timing diagram 400 is shown having a horizontal axis representative of time in units of ms and a vertical axis representative of voltage in units of V. The timing diagram 400 is shown for VSIG having a frequency of approximately 50 Hz. The timing diagram 400 shows the signals noted above responsive to receipt of a rising edge of VSIG.

As shown in the timing diagram 400, the rising edge in VSIG is translated to a rising edge in VMID through the transistor 216. Because the gates of the transistors 216, 218 have been charged in response to the falling edge of VMID, such as described above with respect to FIG. 3, NGATE is sufficiently greater in value than VMID such that the transistors 216, 218 remain conductive as VSIG increases in value.

Figure 5:
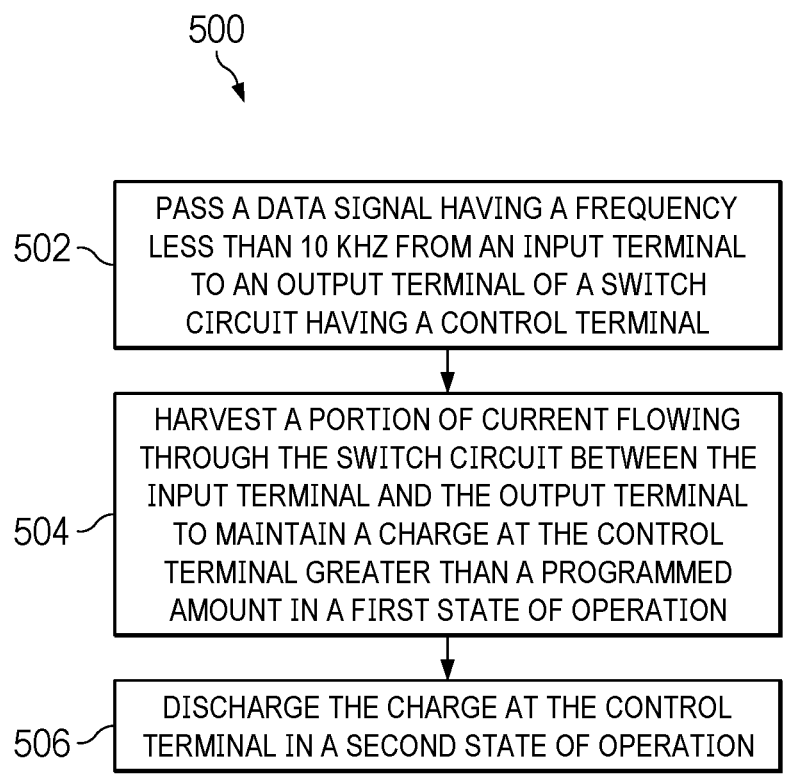
FIG. 5 is a flow diagram of an example method.

FIG. 5 is a flow diagram of an example method 500. In some examples, the method 500 is a method for control of a circuit such as the signal pass circuit 106. Accordingly, reference may be made to components of the signal pass circuit 106, or other figures of this description, in describing the method 500. For example, the method 500 may be implemented at least in part by the signal pass circuit 106, and may be implemented in part by a controller, such as the controller 104. The method 500 may be implemented to pass or block a signal having a greater voltage than a supply voltage of the circuit implementing the method 500 while limiting the generation of noise in the circuit. In at least some examples, the method 500 may facilitate the passage or blocking of signals having lower frequency than other approaches, such as various boot-strap architecture approaches.

At operation 502, a data signal is passed having a frequency of less than 10 kHz from an input terminal to an output terminal of a switch circuit having a control terminal. In some examples, the data signal is VSIG and the switch circuit is the switch circuit 206, as described above herein. In some examples, the data signal has a frequency less than about 5 kHz, less than about 1 kHz, less than about 500 Hz, less than about 100 Hz, less than about 50 Hz, less than about 10 Hz, less than about 1 Hz, or equal to about 0.01 Hz. In some examples, the data signal may have a frequency up to approximately 25 MHz or greater. In some examples, the data signal has a peak voltage greater in value than a supply voltage of the switch circuit.

At operation 504, a portion of current flowing through the switch circuit between the input terminal and the output terminal is harvested to maintain a charge at the control terminal greater than a programmed amount in a first state of operation. In so In some examples, the programmed amount is a threshold amount (e.g., such as a Vgs threshold for the transistors 216, 218) with respect to a value of VMID. In some examples, the first state of operation is operation of the signal pass circuit responsive to EN having an asserted value.

At operation 506, the charge at the control terminal is discharged in a second state of operation. In some examples, the second state of operation is operation of the signal pass circuit responsive to EN having a deasserted value. The charge at the control terminal may be discharged by, for example, shorting the control terminal to the node 272. In an example, discharging the charge at the control terminal turns off the switch circuit 206 such that VSIG is not provided to the processing circuit 108.

In this description, the term "couple" may cover connections, communications, or signal paths that enable a functional relationship consistent with this description. For example, if device A provides a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal provided by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be coupled to at least some of the passive elements and/or the sources to form the described structure either at a time of manufacture or after a time of manufacture, for example, by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors and capacitors, unless otherwise stated, include first and second terminals and are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground voltage potential" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter. Modifications are possible in the described examples, and other examples are possible within the scope of the claims.

What is claimed is:

1. An apparatus, comprising:
a shutoff circuit having an input and including a first transistor having a control terminal and first and second terminals;
a switch circuit including a second transistor having a control terminal and first and second terminals, the control terminal of the second transistor is coupled to the first terminal of the first transistor, and the first terminal of the second transistor is coupled to the second terminal of the first transistor;
a first capacitor having a first terminal coupled to a voltage terminal, and having a second terminal;

a second capacitor having a first terminal coupled to the second terminal of the first capacitor, and having a second terminal coupled to the second terminal of the first transistor and to the first terminal of the second transistor;

a first diode having a first anode and a first cathode, the first anode is coupled to the second terminal of the first capacitor and to the first terminal of the second capacitor, and the first cathode is coupled to the input of the shutoff circuit;

a second diode having a second anode and a second cathode, the second anode is coupled to the second terminal of the second capacitor, to the second terminal of the first transistor, and to the first terminal of the second transistor, and the second cathode is coupled to the first anode, to the second terminal of the first capacitor, and to the first terminal of the second capacitor; and a third diode having a third anode and a third cathode, the third anode is coupled to the second terminal of the first capacitor, to the first terminal of the second capacitor, to the first anode, and to the second cathode, and the third cathode is coupled to the control terminal of the second transistor and to the first terminal of the first transistor.

2. The apparatus of claim 1, further comprising:
a third transistor having a gate, a source, and a drain, the source of the third transistor is coupled to the voltage terminal; and
a fourth diode having a fourth anode and a fourth cathode, wherein the fourth anode is coupled to the drain of the third transistor, and the fourth cathode is coupled to the gate of the second transistor.

3. The apparatus of claim 1, further comprising a third transistor having a gate, a source, and a drain, the source of the third transistor is coupled to the voltage terminal, and the drain of the third transistor is coupled to the first terminal of the first capacitor.

4. The apparatus of claim 1, wherein the first terminal of the second transistor is a drain, the second terminal of the second transistor is a source, and the switch circuit includes:
a third transistor having a gate, a source, and a drain, the gate of the third transistor is coupled to the gate of the second transistor, and the source of the third transistor is coupled to the source of the second transistor.

5. The apparatus of claim 1, further comprising:
a third transistor having a gate, a source, and a drain, the source of the third transistor is coupled to the voltage terminal;
a fourth diode having a fourth anode and a fourth cathode, wherein the fourth anode is coupled to the drain of the third transistor;
a fifth diode having a fifth anode and a fifth cathode, wherein the fifth cathode is coupled to the gate of the first transistor;
a third capacitor having a first terminal coupled to the fourth cathode and a second terminal coupled to the fifth anode;
a fourth capacitor having a first terminal coupled to the second terminal of the third capacitor and having a second terminal coupled to the second terminal of the second transistor; and
a sixth diode having a sixth anode and a sixth cathode, wherein the sixth anode is coupled to the second terminal of the second transistor, and the sixth cathode is coupled to the fifth anode.

6. The apparatus of claim 1, wherein the shutoff circuit includes:
a third transistor having a gate, a source, and a drain, and the third transistor is configured to receive a first bias current at its source;
a fourth transistor having a gate, a source, and a drain, the fourth transistor is configured to receive a second bias current at its source;
a fourth diode having a fourth anode and a fourth cathode, the fourth anode is coupled to the drain of the third transistor;
a fifth diode having a fifth anode and a fifth cathode, wherein the fifth anode is coupled to the drain of the fourth transistor, and the fifth cathode is coupled to the gate of the first transistor;
a fifth transistor having a gate, a source, and a drain, the gate of the fifth transistor is coupled to the fourth cathode, and the source of the fifth transistor is coupled to the second terminal of the second transistor;
a sixth transistor having a gate, a source, and a drain, the gate of the sixth transistor is coupled to the fifth cathode, and the source of the sixth transistor is coupled to the second terminal of the second transistor;
a first resistor having a first terminal coupled to the fourth cathode and having a second terminal coupled to the drain of the sixth transistor;
a second resistor having a first terminal coupled to the fifth cathode and having a second terminal coupled to the drain of the fifth transistor;
a sixth diode having a sixth anode and a sixth cathode, the sixth anode is coupled to the second terminal of the second transistor and the sixth cathode is coupled to the fourth cathode;
a third capacitor having a first terminal coupled to the fourth cathode and having a second terminal coupled to the second terminal of the second transistor, in which the fourth cathode is the input of the shutoff circuit;
a seventh diode having a seventh anode and a seventh cathode, the seventh anode is coupled to the second terminal of the second transistor and the seventh cathode is coupled to the gate of the first transistor; and
a fourth capacitor having a first terminal coupled to the gate of the first transistor and having a second terminal coupled to the second terminal of the second transistor.

7. The apparatus of claim 1, wherein the second diode is a Zener diode.

8. The apparatus of claim 1, further comprising a charge circuit comprising the first and second capacitors, and the first, second, and third diodes, wherein the charge circuit is configured to harvest a portion of current flowing through the switch circuit to maintain a charge at a control terminal of the switch circuit greater than a predetermined amount.

9. The apparatus of claim 8, wherein the charge circuit is configured to maintain the charge at the control terminal of the switch circuit in a first state of operation, and wherein the shutoff circuit is configured to discharge the charge at the control terminal of the switch circuit in a second state of operation.

10. The apparatus of claim 8, wherein the charge circuit is configured to modify a voltage provided at the control terminal of the switch circuit in an amount proportional to a change in voltage of a data signal.

11. The apparatus of claim 1, wherein the switch circuit is configured to control passage of a data signal having a frequency of less than about 10 kilohertz (kHz).

12. The apparatus of claim 11, wherein the switch circuit is configured to control passage of the data signal having a frequency of less than about 1 KHz.

13. The apparatus of claim 12, wherein the switch circuit is configured to control passage of the data signal having a frequency of less than about 1 Hz.

14. The apparatus of claim 1, wherein the switch circuit is configured to control passage of a data signal having a voltage greater than a voltage at the voltage terminal.

15. The apparatus of claim 14, wherein the apparatus comprises a sensor coupled to the switch circuit, and wherein the data signal is a sensor signal.

16. The apparatus of claim 15, further comprising a processor coupled to an output of the switch circuit.

17. The apparatus of claim 1, wherein the first and second transistors are n-type field effect transistors.

18. The apparatus of claim 1, wherein the switch circuit comprises a third transistor having a first terminal coupled to the first terminal of the second transistor, and a control terminal coupled to the control terminal of the second transistor.

19. The apparatus of claim 18, wherein the second and third transistors are field effect transistors, and wherein the first terminal of the second transistor is a source terminal, the second terminal of the second transistor is a drain terminal, the first terminal of the third transistor is a source terminal, and the second terminal of the third transistor is a drain terminal.

20. The apparatus of claim 18, further comprising a pre-charge circuit having a fourth transistor having a first terminal coupled to the control terminal of the third transistor via a diode.

* * * * *